United States Patent
Nakahara (10) Patent No.: US 7,352,193 B2
(45) Date of Patent: Apr. 1, 2008

(54) VOLTAGE-IMPRESSED CURRENT MEASURING APPARATUS AND CURRENT BUFFERS WITH SWITCHES USED THEREFOR

(75) Inventor: Hisaharu Nakahara, Hanyu (JP)

(73) Assignee: Advantest Corporation, Tokyo (JP)

( * ) Notice: Subject to any disclaimer, the term of this patent is extended or adjusted under 35 U.S.C. 154(b) by 33 days.

(21) Appl. No.: 10/537,563

(22) PCT Filed: Dec. 11, 2003

(86) PCT No.: PCT/JP03/15839

§ 371 (c)(1),
(2), (4) Date: Jun. 3, 2005

(87) PCT Pub. No.: WO2004/053507

PCT Pub. Date: Jun. 24, 2004

(65) Prior Publication Data

US 2006/0244433 A1   Nov. 2, 2006

(30) Foreign Application Priority Data

Dec. 11, 2002  (JP) .............................. 2002-359183

(51) Int. Cl.
*G01R 27/08* (2006.01)
*G01R 19/00* (2006.01)

(52) U.S. Cl. .................................... 324/713; 324/76.11
(58) Field of Classification Search ................. 324/713
See application file for complete search history.

(56) References Cited

U.S. PATENT DOCUMENTS

| 3,772,595 | A | * | 11/1973 | De Wolf et al. ............. 714/736 |
| 3,978,402 | A | * | 8/1976 | Ryder ......................... 324/607 |
| 5,414,352 | A | * | 5/1995 | Tanase ....................... 324/158.1 |
| 5,521,493 | A | * | 5/1996 | Persons ..................... 324/158.1 |
| 6,255,842 | B1 | * | 7/2001 | Hashimoto .................. 324/765 |
| 6,940,271 | B2 | * | 9/2005 | West ......................... 324/158.1 |
| 2002/0171446 | A1 | * | 11/2002 | Takechi et al. ............. 324/765 |

FOREIGN PATENT DOCUMENTS

| JP | 63082377 | * | 9/1986 |
| JP | 63-082377 | | 4/1988 |
| JP | 05-119110 | | 5/1993 |
| JP | 08-054424 | | 2/1996 |
| JP | 10-010162 | | 1/1998 |
| JP | 2001-166005 | | 6/2001 |

* cited by examiner

*Primary Examiner*—Andrew H. Hirshfeld
*Assistant Examiner*—Jeff Natalini
(74) *Attorney, Agent, or Firm*—David N. Lathrop, Esq.; Larry Mendenhall, Esq.; Gallagher & Lathrop (57) ABSTRACT

A voltage-impressed current measuring apparatus, wherein the voltage from a direct-current power supply portion is impressed on the terminal of a device under test via a range switching portion and the current flowing in the same terminal is measured; wherein the range switching portion has a plurality of current buffers with switches corresponding to current measurement ranges, and a plurality of current measurement resistances respectively connected in series to the output sides of the same; and wherein the current flowing in the terminal of the device under test is measured by measuring the voltage across both ends of the current measurement resistance of the selected series connection, by a voltage difference measuring portion. Each current buffer with switch has an output stage capable of connection/disconnection in response to a control signal.

9 Claims, 7 Drawing Sheets

FIG. 1A

PRIOR ART

FIG. 1B

PRIOR ART

FIG. 1C

PRIOR ART

VOLTAGE-IMPRESSED CURRENT MEASURING APPARATUS AND CURRENT BUFFERS WITH SWITCHES USED THEREFOR

TECHNICAL FIELD

This invention pertains to a voltage-impressed current measuring apparatus of a semiconductor test apparatus and current buffers with switches used therefor, for which miniaturization, or the design into an MCM (Multi Chip Module), or an IC (Integrated Circuit), of the analog circuitry is possible.

PRIOR ART

In Japanese Patent Application Kokai Publication No. 5-119110, there is set forth a direct-current measuring device used in direct-current tests of an IC measuring apparatus and set up to supply a set constant current or a constant voltage to a load (device under test, DUT) and to switch, in accordance with the load current range, detection resistors detecting the voltage generated in the load or the current flowing in the load at that time.

In Japanese Patent Application Kokai Publication No. 8-54424, there is set forth a voltage-impressed current measuring apparatus in which the range-switching circuit is eliminated and higher speeds and a smaller size are attained.

In Japanese Patent Application Kokai Publication No. 10-10162, there is set forth, in a current detection circuit as well as in a voltage-impressed current measuring circuit and a constant-current supply circuit using said circuit, a current detection circuit wherein the number of leak-proof relays switching the current detection resistors has been reduced.

Figure 1A:
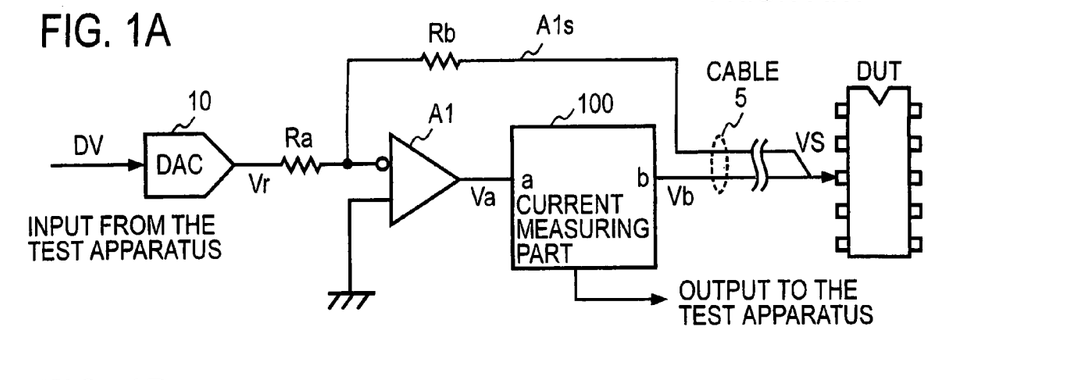
FIG. 1A is a block diagram showing a configuration example of a conventional voltage-impressed current measuring circuit.

FIG. 1A shows schematically the configuration of the conventional voltage-impressed current measuring circuit set forth in the aforementioned Japanese Patent Application Kokai Publication No. 5-119110. Further, voltage-impressed current measuring circuits shown in FIG. 1A are provided respectively for a plurality of measurement channels corresponding to a plurality of terminal pins of the semiconductor integrated circuit being the device under test, as is ordinary for semiconductor test apparatuses.

This voltage-impressed current measuring circuit has a DA (Digital to Analog) converter 10, resistances Ra and Rb, an operational amplifier A1, a current measuring portion 100, and a cable 5, impresses a desired test voltage Vs on a terminal of the device under test (DUT), and measures the current flowing in the same terminal by means of current measuring portion 100.

DA converter 10 receives the desired setting data DV to be impressed on the DUT from the exterior, and generates a corresponding direct-current reference voltage Vr. This reference voltage Vr is supplied to an inverted input terminal of operational amplifier A1 through resistance Ra.

Operational amplifier A1 is a power operational amplifier supplying a positive or negative direct-current voltage to the DUT, which receives said reference voltage Vr and, based on resistances Ra, Rb, controls by feedback via a feedback path Als that DUT terminal voltage Vs is at a prescribed fixed direct-current voltage. This voltage Vs can e.g. be expressed as Vs=Rb*Vr/Ra. The output voltage Va of operational amplifier A1 is impressed on the DUT terminal via current measuring portion 100. Further, the non-inverted input terminal of operational amplifier A1 is connected to circuit ground GND.

Figure 1B:
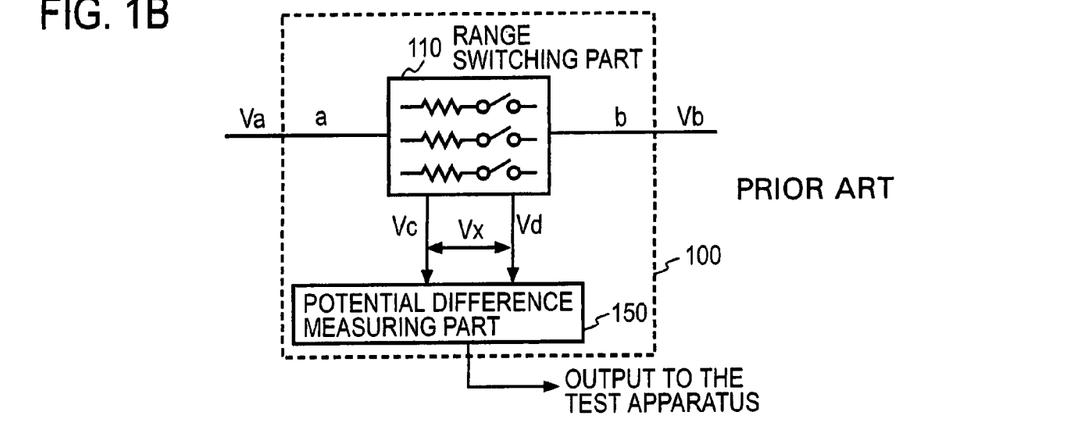
FIG. 1B is a theoretical block diagram of current measuring portion 100 in FIG. 1A.
Figure 1C:
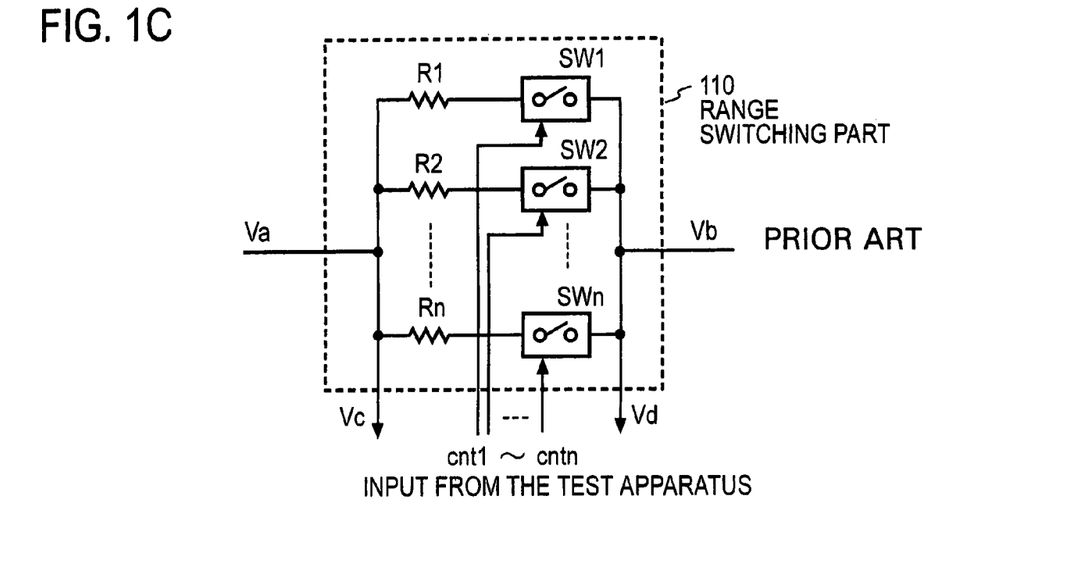
FIG. 1C is a diagram showing a concrete configuration example of range switching portion 110 in FIG. 1B.

Current measuring portion 100 is a measuring portion measuring the load current of the DUT, which detects the current volume flowing to the DUT by measuring the voltage generated across the two ends of a resistance inserted in series, converts the voltage to a digital value, and supplies it as measurement data to a test apparatus, which is not illustrated. As for the current measurement range, a broad range from several $\mu$A to several tens of mA is required. Because of this, current measuring portion 100 is provided with a range switching portion 110 and a potential difference measuring portion 150, as shown in FIG. 1B. Said range switching portion 110 is, as shown in FIG. 1C, provided with a plurality of n series resistances R1 to Rn and switches SW1 to SWn, which are respectively connected in series to these resistances.

Since switches SW1 to SWn in range switching portion 110 are implemented with high input output isolation, they are composed of commercially available, discrete component photo MOS relays (semiconductor switches using photocouplers having MOS transistors in the output stage) and can be controlled to be switched ON/OFF by external control signals cnt1 to cntn. In case photo MOS relays are used, the range switching time ranges from several hundred $\mu$s to several ms. Moreover, a switch drive current of approximately 10 mA is necessary.

Figure 2:
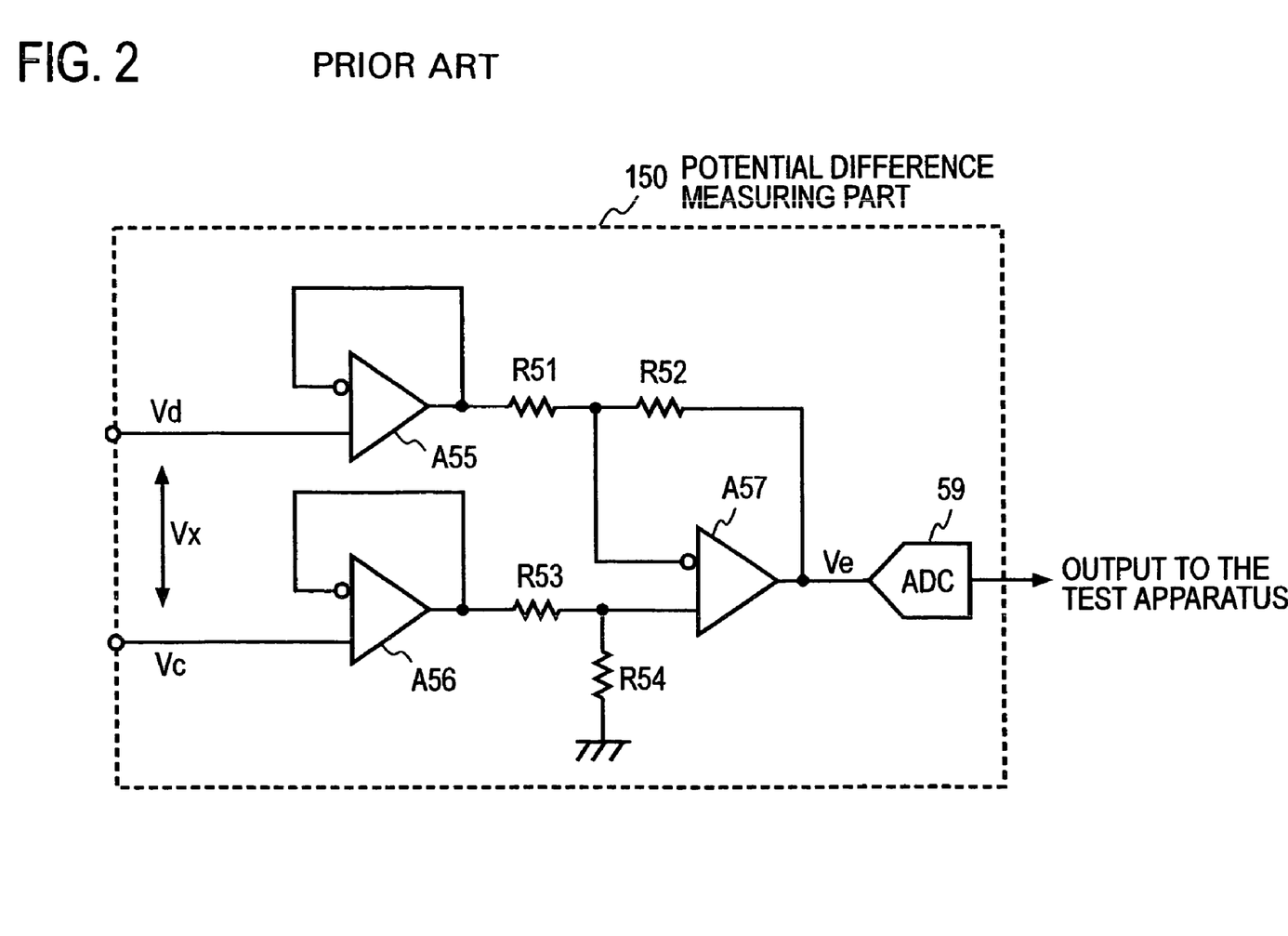
FIG. 2 is a diagram showing the internal circuit configuration of potential difference measuring portion 150 in FIG. 1B.

As an example of a configuration of the internal circuit of potential difference measuring portion 150, there is a configuration wherein voltages Vc, Vd at the two ends of a series resistance Ri (i being an integer such that $1 \leq i \leq n$) selected by switch SWi, as shown in FIG. 2, are received with high impedance by operational amplifiers A55, A56, and the potential difference Vx between the two ends is converted into a digital value. This circuit, set forth e.g. in U.S. Pat. No. 6,255,839, enables setting Vx=Ve by appropriately choosing the values of resistances R51 to R54. Voltage Ve is converted into a digital value by an AD converter 59 and supplied to a test apparatus which is not illustrated.

As explained above, since switches SW1 to SWn switching measurements in a broad current range from several $\mu$A to several tens of mA are composed of discrete component photo MOS relays, if they are based on the prior-art range switching means used in voltage-impressed current measurement circuits and the like, there is the drawback that it is not possible to miniaturize, or design into an MCM (Multi Chip Module) or an IC, all of the analog circuitry in the voltage-impressed current measurement circuits and the like. Moreover, there is also the drawback that the range switching time is in the region of several hundred $\mu$s to several ms. In addition, there is also the drawback that the drive current for the ON/OFF control requires approximately 10 mA.

Accordingly, it is an objective of the present invention to provide a voltage-impressed current measuring apparatus and current buffers with switches used therefor, for which miniaturization, or the design into an MCM or an IC, of the analog circuitry is possible.

DISCLOSURE OF THE INVENTION

According to this invention, a voltage-impressed current measuring apparatus which impresses a prescribed voltage and measures the current flowing to a load apparatus, is configured so as to comprise a current-range switching portion having: a plurality of pairs connecting in series a plurality of current buffers with switches, the buffers having output stages capable of being electrically connected or disconnected in response to a supplied control signal, and current measurement resistances of differing resistance values respectively connected to the output stages of the current buffers with switches, wherein any one of the pairs is selected by a control signal to switch the current measurement range, said output stage of the current buffer with switch of said selected pair taken to be in a connected state;

a direct-current power supply portion, supplying a prescribed direct-current voltage to said load apparatus through the series connection of the current buffer with switch and current measurement resistance selected by said current range switching means; and a potential difference measuring means, measuring, as a value corresponding to the current flowing in said load apparatus, the potential difference across the two ends of the current measurement resistance of said series connection due to the current which accompanies the impression of said direct-current voltage on said load apparatus and flows from the current buffer with switch of said selected series connection to said load apparatus.

According to this invention, the current buffers with switches each have a pre-stage portion and an output stage, wherein said output stages have complementary first and second transistors which have their emitters mutually connected, the voltage of the same connection point taken to be the output voltage of said current buffers with switches, and their collectors connected respectively to a positive power supply and a negative power supply; and wherein said pre-stage portions are configured so as to each comprise a first PNP transistor and a first NPN transistor, in which: the emitters are respectively connected to a first and a second constant-current supply; the collectors are respectively connected to a negative power supply and a positive power supply, the voltage from said direct-current power supply portion being supplied to the respective bases as the input voltage; and a first base voltage, the base emitter voltage added to said input voltage, and a second base voltage, the base emitter voltage subtracted from said input voltage, are supplied from the respective emitters to the bases of said complementary first and second transistors;

a second PNP transistor having a collector and an emitter connected respectively to the base of said complementary second transistor and said positive power supply; a second NPN transistor having a collector and an emitter connected respectively to the base of said complementary first transistor and said negative power supply; and a control means, which, when said current buffer with switch is non-selected in response to said control signal, supplies to said first and second constant-current supplies a first and a second OPEN signal changing said first and second constant-current supplies to OFF, supplies a third and a fourth OPEN signal to the bases of said second PNP transistor and said second NPN transistor putting the same transistors into the ON state, thereby holding said complementary first and second transistors of said output stage in the OFF state; and which, when said current buffer with switch is selected, supplies to said first and second constant-current supplies a first and a second OPEN signal changing said first and second constant-current supplies to ON, and supplies a third and a fourth OPEN signal to the bases of said second PNP transistor and said second NPN transistor putting the same transistors into the OFF state, thereby putting said complementary first and second transistors of said output stage into the ON state.

BEST MODE FOR IMPLEMENTING THE INVENTION

Below, an embodiment of a voltage-impressed current measuring apparatus according to the present invention will be explained with reference to the figures. Moreover, neither is the scope of the patent claims limited by the explanation contents of the working mode mentioned hereinafter, nor are the elements, connection relationships, or the like explained with the working mode necessarily required. In addition, the appearance/shape of the elements, connection relationships or the like explained with the working mode is an example and the invention is not limited to the same appearance/shape.

Further, like numerals are attached to elements corresponding to the conventional configuration, and the explanation of elements with like numerals is omitted except where needed.

Figure 3:
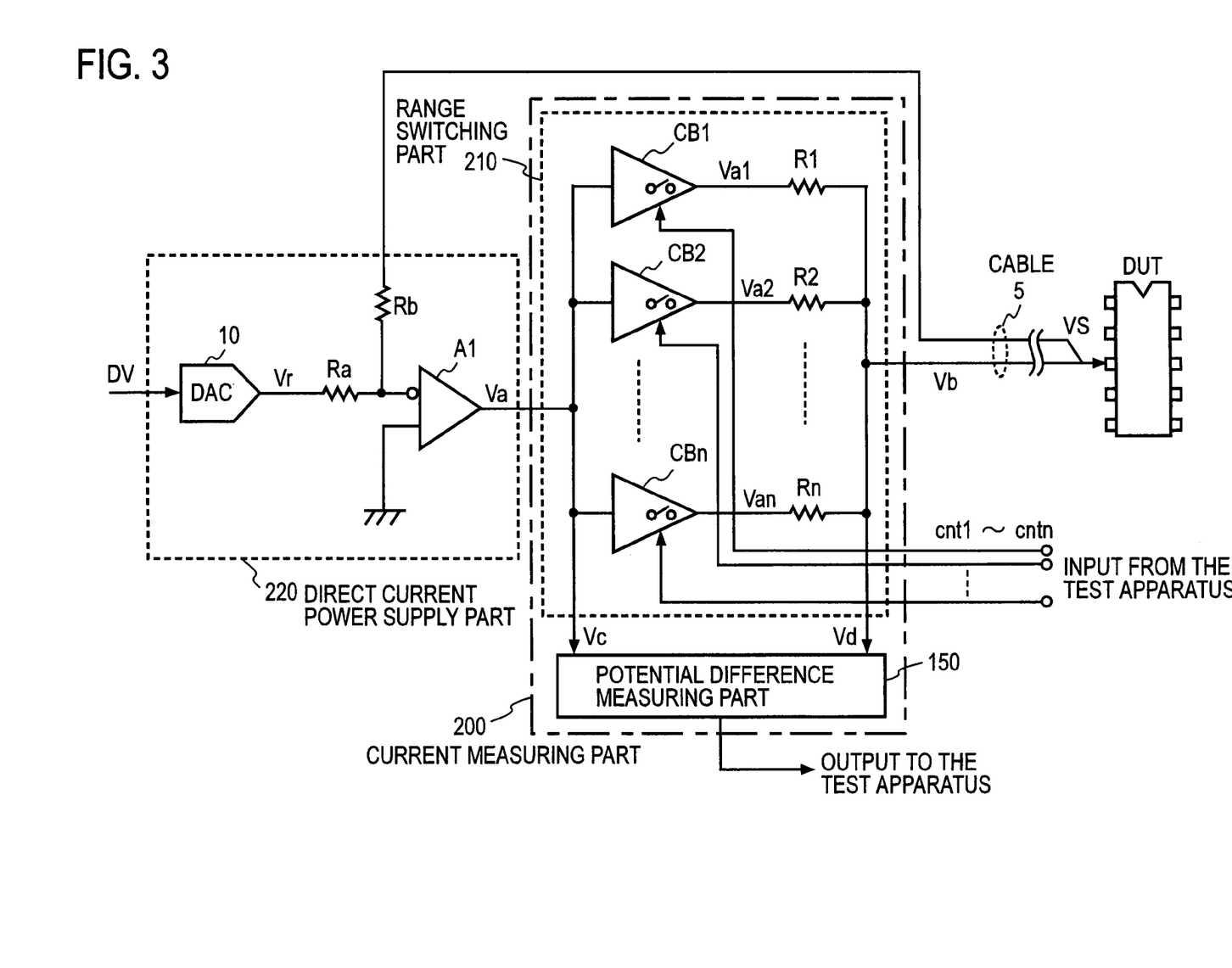
FIG. 3 is a block diagram showing an embodiment of a voltage-impressed current measuring apparatus according to the present invention.

FIG. 3 shows an embodiment of a voltage-impressed current measuring apparatus according to this invention. The voltage-impressed current measuring apparatus is composed of a direct-current power supply portion 220 and a current measuring portion 200. Direct-current power supply portion 220 is composed of a DA converter 10, resistances Ra, Rb, and an operational amplifier A1, these performing the same operations as the corresponding parts in FIG. 1A. Current measuring portion 200 is composed of a range switching portion 210 and a potential difference measuring portion 150. In this embodiment, the configuration of the circuitry of current range switching portion 210 is provided with a plurality of (n) current buffers with switches CB1 to CBn, and series resistances R1 to Rn for current measurement that are respectively connected to the outputs of the same, as shown in FIG. 3.

Each current buffer with switch CBi (i being an integer satisfying $1 \leq i \leq n$) has an output stage making it possible to control it to be in an open state (electrically OFF state) by a control signal cnti supplied from the exterior (e.g. a test apparatus which is not illustrated). The output stage of each current buffer with switch CBi is connected in series with a corresponding series resistance Ri.

Figure 4:
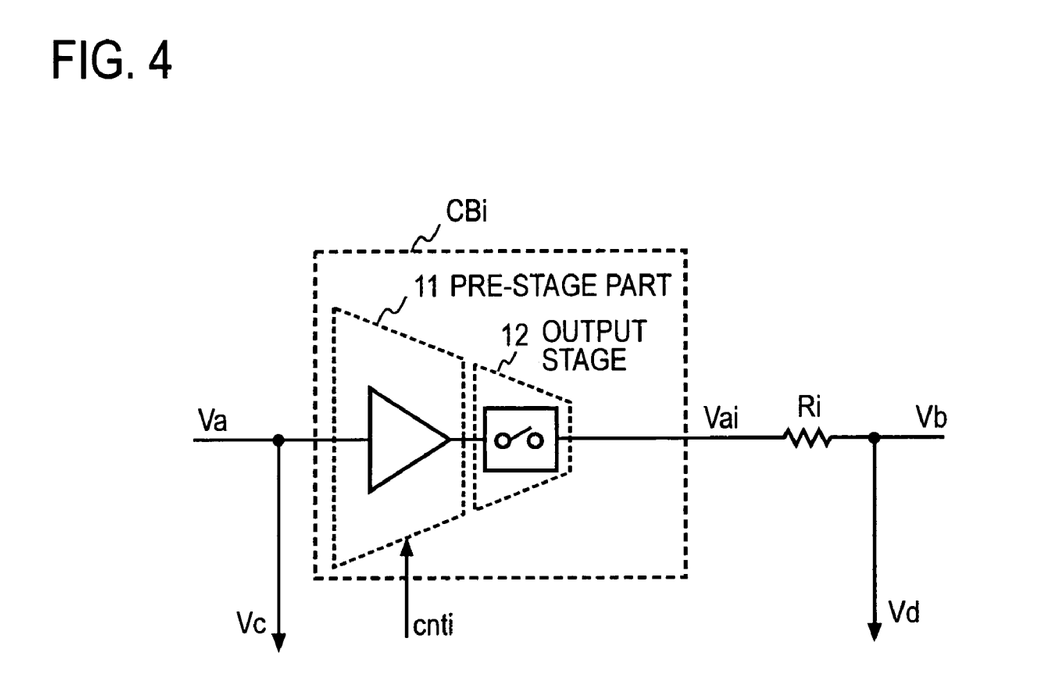
FIG. 4 is a diagram showing a configuration example of current buffer with switch CBi in FIG. 3.

The internal configuration of each current buffer with switch CBi includes, as shown e.g. in FIG. 4, a pre-stage portion 11 and an output stage 12. Pre-stage portion 11, together with operating as a current buffer, controls the ON/OFF switching of output stage 12 by control signal cnti from the test apparatus. Output stage 12 is composed of complementary configuration transistors and can be controlled to be ON/OFF in a high-impedance state by pre-stage portion 11, based on control signal cnti.

Figure 5:
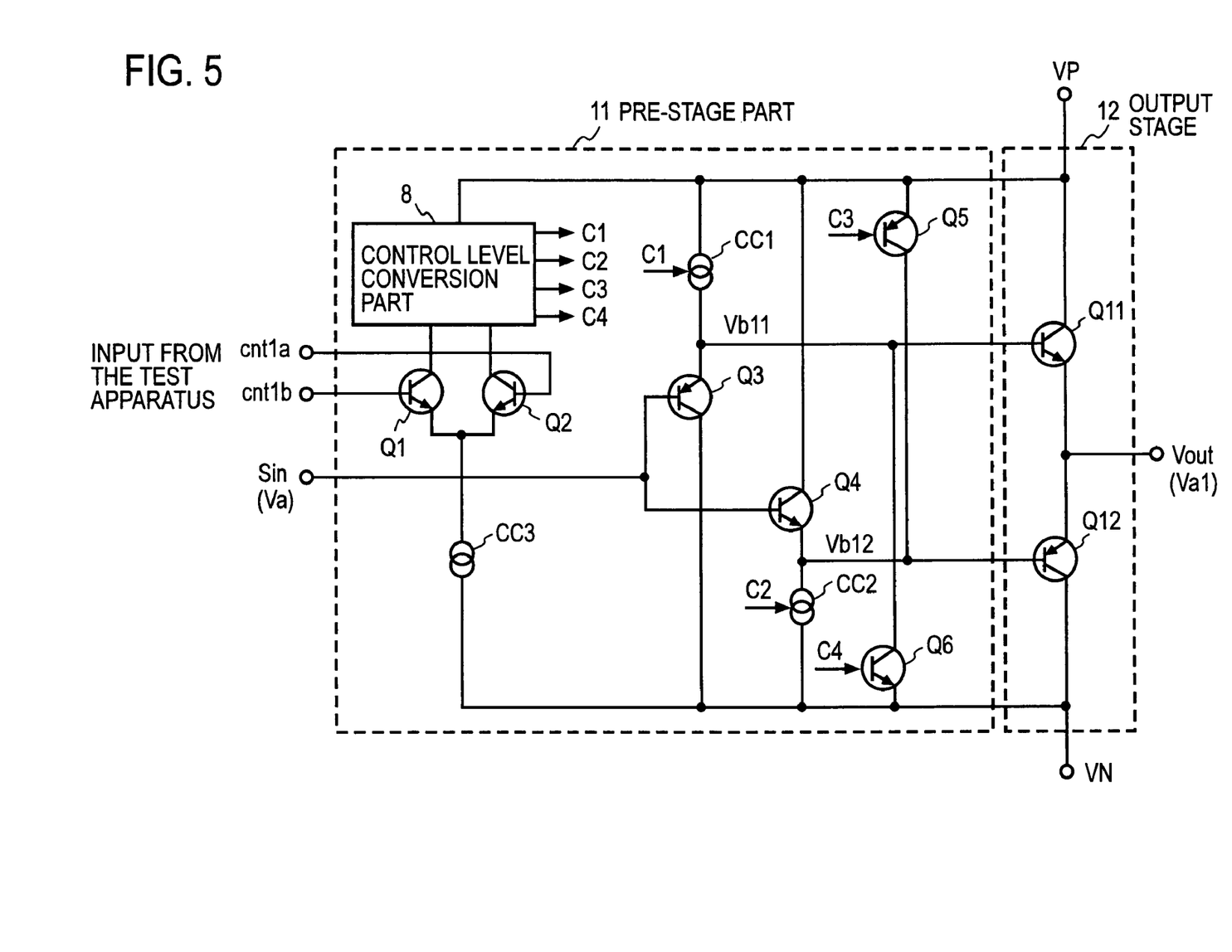
FIG. 5 is a circuit diagram showing a concrete circuit configuration example of pre-stage portion 11 and output stage 12 of current buffer with switch CBi in FIG. 4.

FIG. 5 is a concrete circuit configuration example of pre-stage portion 11 and output stage 12 of current buffer CB1 with switch. Pre-stage portion 11 is provided with differential transistors Q1, Q2, constant-current sources CC1, CC2, CC3, a control level conversion means 8, PNP transistors Q3, Q5, and NPN transistors Q4, Q6. Output stage 12 is provided with a PNP transistor Q12 and an NPN transistor Q11 having their emitters mutually connected. The power supply uses a positive power supply VP and a negative power supply VN. An explanation will be given of the case where differential control signals cnt1a and cnt1b are used as external control signal cnt1.

The emitters of differential transistors Q1 and Q2 are respectively connected to constant-current source CC3, and their collectors are connected via control level conversion portion 8 to positive power supply VP. Differential transistors Q1 and Q2 mutually become inverted to operate in ON/OFF states by control signals cnt1 and cnt2, and control level conversion portion 8 outputs predetermined OPEN signals C1, C2, C3, C4 on the basis of the pair of the same states.

PNP transistor Q3 has an input voltage Sin (i.e. voltage Va from direct-current power supply portion 220) supplied to its base, its emitter is connected to constant-current source CC1, and its collector is connected to negative power supply VN. Since a fixed current flows in PNP transistor Q3, based on constant-current source CC1, emitter terminal voltage Vb11 becomes higher than input voltage Sin only by the base emitter voltage (approximately 0.6 V), and this voltage is supplied to the base input terminal of NPN transistor Q11 as a first base voltage.

In a similar way, NPN transistor Q4 has its base connected to the base of PNP transistor Q3, to which input voltage Sin is supplied. Since a fixed current is flowing, based on constant-current source CC2 connected to the emitter, emitter terminal voltage Vb12 becomes lower than input voltage Sin only by the base emitter voltage (approximately 0.6 V), and this voltage is supplied to the base input terminal of PNP transistor Q12 as a second base voltage. The collectors of PNP transistors Q5 and NPN transistor Q6, to whose bases OPEN signals C3, C4 are supplied, are respectively connected to the bases of transistors Q12 and Q11 and control the ON/OFF operation of transistors Q12, Q11 by OPEN signals C3, C4.

NPN transistor Q11 and PNP transistor Q12 have a complementary configuration output stage, and in the state where constant-current sources CC1, CC2 are set to ON by OPEN signals C1, C2, both transistors ordinarily operate in a state biased to the active state, based on said first base voltage Vb11 and second base voltage Vb12. Consequently, input voltage Vin is received and an output voltage Vout which is current buffered 1:1 is output.

As mentioned above, control level conversion portion 8 generates four OPEN signals C1, C2, C3, C4 which control the output stage 12 to the OFF state based on external control signal, cnt1, and by supplying e.g. a fixed 1.5 V voltage to one differential control signal, cnt1b, and switching the voltage of the other differential control signal, cnt1a, between 0 V and 3 V, the desired control level OPEN signals C1, C2, C3, C4 are generated based on this reverse operation, since the currents of differential transistors Q1, Q2 operate in reverse.

When first OPEN signal C1 becomes valid, the fixed current of constant-current source CC1 is controlled to be in the OFF state. When second OPEN signal C2 becomes valid, the fixed current of constant-current source CC2 is controlled to be in the OFF state.

When third OPEN signal C3 becomes valid, PNP transistor Q5 is controlled to be in the ON state, and one complementary transistor PNP transistor Q12 is forcibly biased to the OFF state. As a result of this, output voltage Vout can be supplied with high impedance, whatever the voltage range, from positive power supply VP to negative power supply VN, and an open state can be maintained.

When fourth OPEN signal C4 becomes valid, NPN transistor Q6 is controlled to be in the ON state, and the other complementary transistor NPN transistor Q11 is forcibly biased to the OFF state. As a result of this, output voltage Vout can be supplied with high impedance, whatever the voltage range, from positive power supply VP to negative power supply VN, and an open state can be maintained.

Consequently, first, when it is desired to put output stage 12 into the active state (ON state), since it is necessary to bias final stage NPN transistor Q11 and PNP transistor Q12 to the active state, OPEN signals C1, C2 are controlled so that constant-current sources CC1, CC2 are put into the active state, and PNP transistor Q5 and NPN transistor Q6 are controlled to be in the OFF state. As a consequence of this, due to the cancellation of the two base emitter voltage drops of PNP transistor Q3 and NPN transistor Q11, a voltage Vout corresponding to input voltage Sin is output. In a similar way, due to the cancellation of the two base emitter voltage drops of NPN transistor Q4 and PNP transistor Q12, a voltage Vout corresponding to input voltage Sin is output. This is to say that the functioning is that of a normal current buffer. Here, if transistors Q3, Q4, Q11, Q12 are formed on the same IC in order to eliminate the manufacturing variations in said base emitter voltage drops, output voltage Vout can be considered to be at practically the same potential as input voltage Sin.

Second, when it is desired to put output stage 12 into the open state (OFF state), since it is necessary to put final stage NPN transistor Q11 and PNP transistor Q12 completely into the reverse bias state, OPEN signals C1, C2 are controlled so that constant-current sources CC1, CC2 are put into the OFF state, and PNP transistor Q5 and NPN transistor Q6 are controlled to be in the ON state. As a consequence of this, the circuit between the output terminal of output voltage Vout and output stage 12 is put in an open, electrically completely cut off state. Here, regarding NPN transistor Q11 and PNP transistor Q12, transistors are applied which have a breakdown voltage not producing any leakage current with respect to a base emitter reverse voltage bias.

Consequently, it is possible to configure range switching portion 210 shown in FIG. 3 by applying the aforementioned current buffer with switch CB1 of FIG. 4. Because of this, by making the DUT load current flow to a desired series resistance R1 to Rn using external control signals cnt1 to cntn, it becomes possible to measure the current for each range by supplying two voltage signals, of output input side voltage Va (detected voltage Vc) and load side voltage Vb (detected voltage Vd) which are detected based on said series resistance, to potential difference measuring portion

150. In this way, one can, for current buffers with switches CB1 to CBn, make a configuration with transistors, since the same circuit configuration elements are elements which can be made into IC or MCM, so a substantial miniaturization can be implemented. In addition, because the settling time of the ON/OFF control is less than several μs, the advantage can also be obtained that it becomes possible to switch with a remarkably high speed, compared to the past. Also, there is the advantage that, as regards the drive current required for the ON/OFF control, very little is sufficient.

Figure 6:
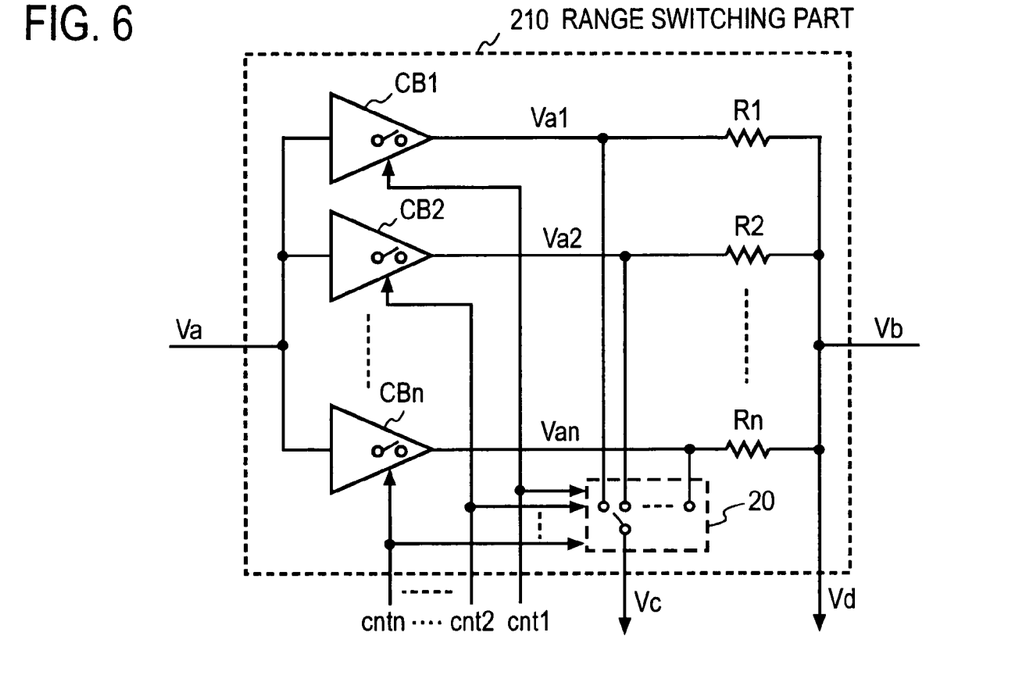
FIG. 6 is a diagram showing another configuration example of current range switching portion 210 in FIG. 3.

FIG. 6 is another circuit configuration example of current range switching portion 210 in the embodiment of FIG. 3. This is a configuration example that cancels the influence on measurement errors of minute potential difference fluctuations that are generated together with the change in the load current volume between each input and output of current buffers with switches CB1 to CBn. This current range switching portion 210 is provided with a plurality of n current buffers with switches CB1 to CBn, series resistances R1 to Rn, and a multiple-contact switch 20 and, instead of detecting voltage Va on the input side of current buffers with switches CB1 to CBn in FIG. 3 as detected voltage Vc, it detects a voltage selected by multiple-contact switch 20 from among output side voltages Va1 to Van as detected voltage Vc.

Since the configuration based on current buffers with switches CB1 to CBn and series resistances R1 to Rn is the same as the aforementioned configuration in FIG. 3, its explanation will be omitted.

Multiple-contact switch 20 receives the voltage signals of one end of each series resistance R1 to Rn and, based on control signals cnt1 to cntn, selectively switches to and outputs one of the signals. A multiple-contact switch 20 such as this can be configured with transistor circuits which can be designed into an IC.

According to the aforementioned configuration in FIG. 6, there is the advantage that measurements can be performed without being subject to the influence of minute potential difference fluctuations which are generated together with changes in the load current volume between each input and output of current buffers with switches CB1 to CBn.

Figure 7:
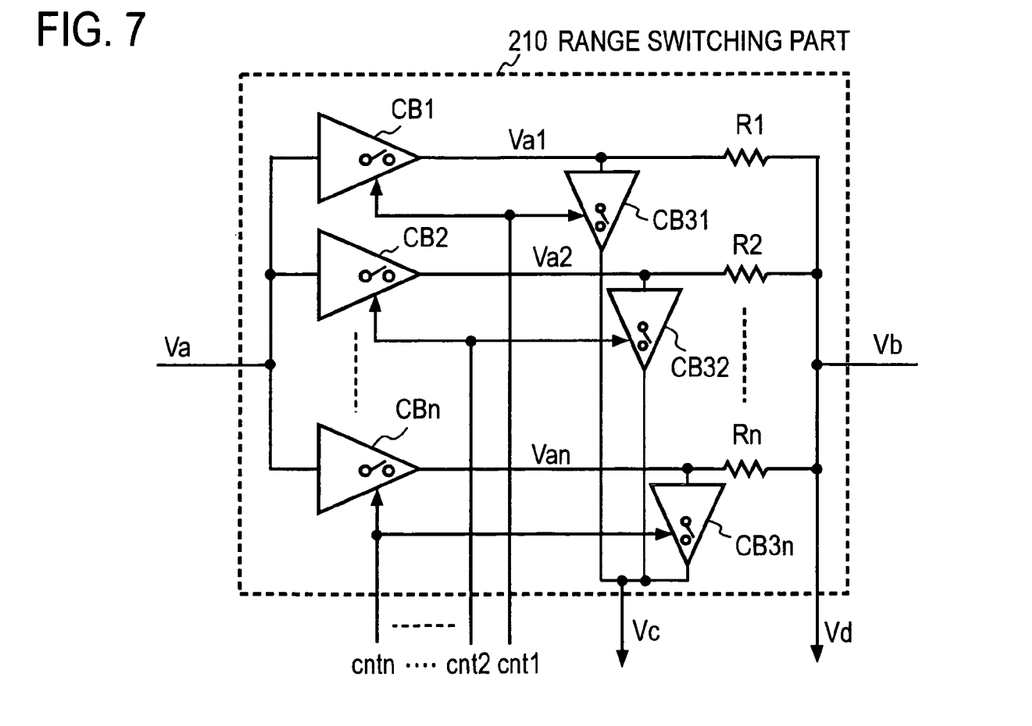
FIG. 7 is a diagram showing yet another configuration example of current range switching portion 210 in FIG. 3.

FIG. 7 is another circuit configuration example of current range switching portion 210. This is a configuration example that cancels the influence on measurement errors of minute potential difference fluctuations that are generated together with the change in the load current volume between each input and output of current buffers with switches CB1 to CBn. This current range switching portion 210 is provided with a plurality of n current buffers with switches CB1 to CBn, series resistances R1 to Rn, and a plurality of n current buffers with switches CB31 to CB3n.

Current buffers with switches CB31 to CB3n are switches transmitting voltage signals, which basically have one and the same internal configuration as the aforementioned current buffer with switch CB1 in FIG. 5. However, since potential difference measuring portion 150 receives with high impedance, there is no need for current buffering, so it is acceptable to have only transmission of the voltage signal. Accordingly, they are not a main cause of voltage drop errors like those caused by the aforementioned current buffers with switches CB1 to CBn.

According to the aforementioned configuration in FIG. 7, there is the advantage that measurements can be performed without being subject to the influence of minute potential difference fluctuations which are generated together with changes in the load current volume between each input and output of current buffers with switches CB1 to CBn.

Further, the technical idea of the present invention is not one which is limited to the concrete configuration examples and connection mode examples of the aforementioned working modes. Moreover, on the basis of the technical idea of the present invention, extensive application may be made by suitably modifying the aforementioned working modes.

E.g., in the case the main cause of the measurement error accompanying the insertion of current buffers with switches CB1 to CBn in the configuration shown in FIG. 3 cannot be disregarded, an added calibration function may be provided, as desired. Specifically, in order to calibrate the different variations in a measurement system comprising series resistances R1 to Rn and potential difference measuring portion 150, known currents are passed at several points in each range and measured with potential difference measuring portion 150, and the linearity correction amount and the offset correction amount are demanded in advance and saved as a table in a memory, which is not illustrated, so as to make the obtained measurement data correlate with known current values. Then, the actual unknown currents are measured and arithmetically processed by reading the corresponding correction amounts from the saved table. In this way, the main cause of the measurement error accompanying the different variations of a measurement system comprising current buffers with switches CB1 to CBn can be practically cancelled, so highly accurate measurement results are obtained, and, additionally, the advantage is obtained that it is also possible to cancel component variations and aging.

Figure 8:
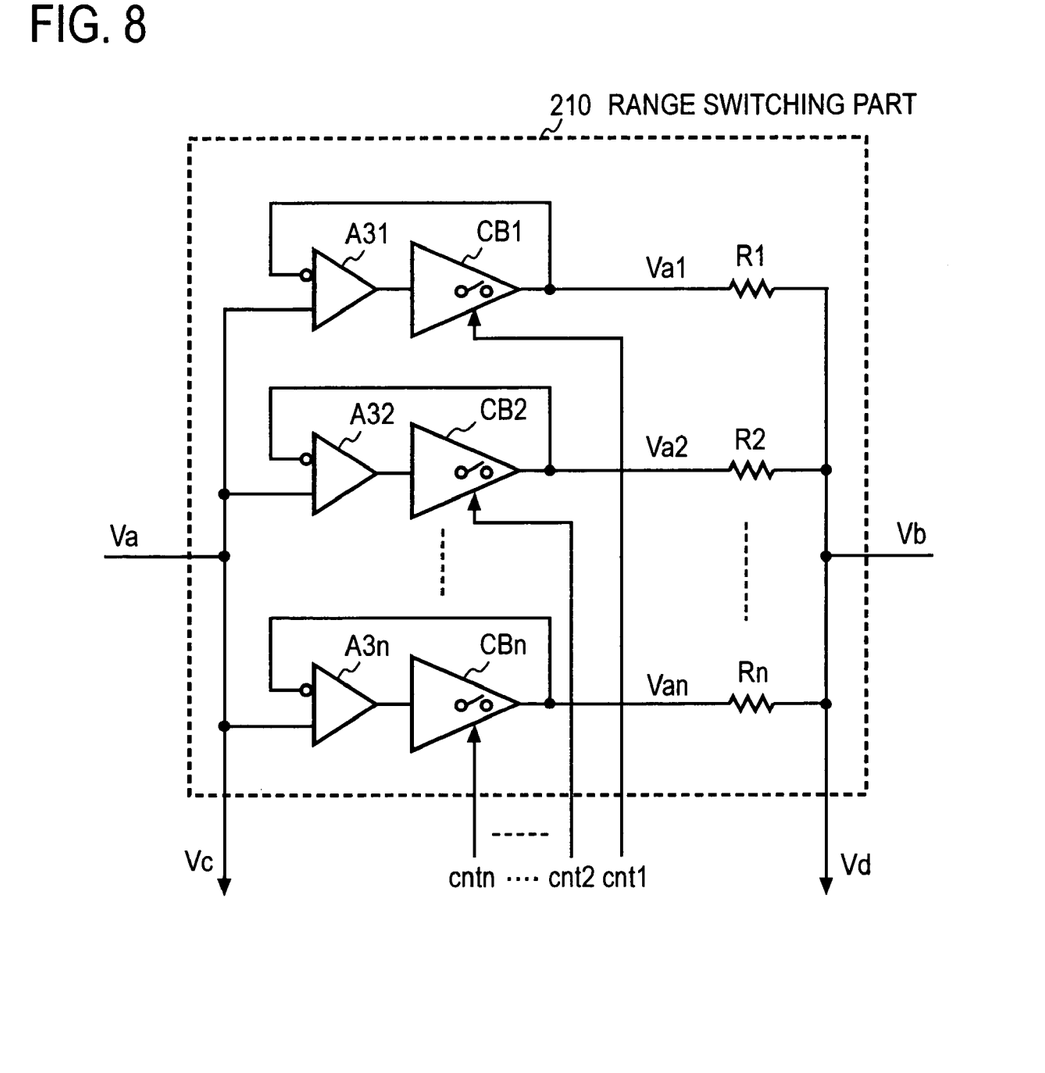
FIG. 8 is a diagram showing a different configuration example of current range switching portion 210 in FIG. 3.

Moreover, in the aforementioned configuration example in FIG. 3, the explanation was given with an embodiment using current buffers with switches CB1 to CBn, but range switching portion 210 shown in FIG. 8 may be used as desired. The current range switching portion 210 in FIG. 8 is composed of feedback operational amplifiers A31 to A3n, current buffers with switches CB1 to CBn connected to the outputs of the same, and series resistances R1 to Rn connected to the outputs of the same current buffers CB1 to CBn. The output of each current buffer with switch CBi is fed back to the inverted input of the corresponding feedback operational amplifier A3i. However, for the terminals of feedback operational amplifiers A31 to A3n, elements measuring at high impedance and not interfering with the measurements are applied. In this case, as a result of the output voltages Va1 to Van of the output terminal of each current buffer with switch CB1 to CBn being feedback controlled by feedback operational amplifiers A31 to A3n so as to match the input and output voltage Va, the advantage is obtained that the individual output voltage error causes of current buffers with switches CB1 to CBn can be cancelled.

EFFECTS OF THE INVENTION

The present invention produces, drawing on the contents of the explanation given above, the effects set out below.

According to the configurations of the present invention mentioned above, the major advantage can be obtained that an implementation is possible with configuration elements that can be designed into an IC or an MCM, and it is also possible to implement a substantial reduction in size.

In addition, because the settling time of the ON/OFF control is less than several μs, the advantage can also be obtained that it becomes possible to switch with a remarkably high speed, compared to the past. In particular, in the case of an application to a voltage-impressed current measuring apparatus of a semiconductor test apparatus, for which there is the necessity to provide a number of channels, there can be obtained the major advantage that the throughput of device tests in the DC test category can be improved. Moreover, there is the advantage that, as regards the drive current required for the ON/OFF control, very little is sufficient.

Accordingly, the technical effects as well the industrial effects of the present invention are large.

What is claimed is:

1. A voltage-impressed current measuring apparatus which impresses a prescribed voltage and measures a current flowing in a load apparatus, comprising:
   a current-range switching portion having a plurality of series connections, each comprising a current buffer with a switch connected in series with a current measurement resistance, wherein
   the respective series connections are connected in parallel to each other,
   each of the current buffers with switches has
   an output stage capable of being electrically connected or disconnected and
   a pre-stage portion controlling the output stage in its connected or disconnected state in response to a control signal supplied thereto and capable of acting as a current buffer,
   the current measurement resistances have different resistance values,
   one end of a measurement resistance connects to the output stage of its respective current buffer with a switch and the other end connects to the output side of the respective series connection connected to the load apparatus, and
   the control signal selects any one of the plurality of series connections to switch the current measurement range so that the output stage of the current buffer with a switch of the selected series connection is taken to be in its connected state;
   a direct-current power supply portion, connected to input ends of the pre-stage portions as input sides of the respective series connections and supplying the prescribed direct-current voltage to the load apparatus through the selected series connection; and
   a potential difference measuring means, measuring, as a value corresponding to the current flowing in the load apparatus due to the impression of the direct-current voltage on the load apparatus, a potential difference between the input side and the output side of the selected series connection due to the current which flows from the current buffer with a switch of the selected series connection to the load apparatus.

2. The voltage-impressed current measuring apparatus according to claim 1, wherein the direct-current power supply portion comprises
   a digital-to-analog converter which converts a digital voltage supplied to an input end thereof to an analog reference voltage, and
   an operational amplifier to which the reference voltage is applied and which is controlled by feedback of the voltage impressed on the load apparatus so that an output voltage thereof is supplied to the load apparatus via the range switching portion.

3. The voltage-impressed current measuring apparatus according to claim 2, wherein:
   the input sides of the plurality of current buffers with switches of the current-range switching portion are connected to the output side of the operational amplifier; and
   a voltage at the input side of the current buffer with a switch and a voltage at the output side of the current measurement resistances of the selected series connection are supplied to the potential difference measuring portion to measure a potential difference there between.

4. A voltage-impressed current measuring apparatus according to claim 2, wherein:
   the input sides of said plurality of current buffers with switches of said range switching portion are mutually connected and are connected to the output side of said operational amplifier;
   the output sides of said current measurement resistances are mutually connected;
   said range switching portion additionally selects, in response to said control signal, one output of said plurality of current buffers with switches;
   there is provided a multiple-contact switch supplying said one output to said potential difference measuring portion as the voltage at one end of said current measurement resistance of said selected series connection; and
   said voltage at the output side of said current measurement resistance is supplied to said potential difference measuring portion as the voltage on the side of the other end of the current measurement resistance of said selected series connection.

5. A voltage-impressed current measuring apparatus according to claim 2, wherein:
   the input sides of said plurality of current buffers with switches of said range switching portion are mutually connected and are connected to the output side of said operational amplifier;
   the output sides of said current measurement resistances are mutually connected;
   said range switching portion additionally has buffers with switches, having output stages which can be connected or blocked in response to control signals and being respectively connected to the output sides of said plurality of current buffers with switches;
   the output of one buffer with switch, selected by said control signal, is supplied to the potential difference measuring portion as the voltage on the side of one end of said current measurement resistance of said selected series connection; and
   said voltage on the output sides of said current measurement resistances is supplied to said potential difference measuring portion as the voltage on the side of the other end of the current measurement resistance of said selected series connection.

6. A voltage-impressed current measuring apparatus according to claim 2, wherein:
   the output sides of said current measurement resistances of said plurality of series connections are mutually connected;
   said range switching portion additionally comprises, with respect to each said current buffer with switch, feedback operational amplifiers having inverted inputs to which are connected the outputs of the same current buffers with switches, non-inverted inputs to which is supplied the voltage from said current power supply portion, and outputs to which are connected the inputs of said current buffers with switches;
   the voltage supplied to the non-inverted input of each said feedback operational amplifier is supplied to said potential difference measuring portion as the voltage on the side of one end of said current measurement resistance of said selected series connection; and
   the voltage on the output side of said current measurement resistance is supplied to said potential difference measuring portion as the voltage on the side of the other end of the current measurement resistance of said selected series connection.

7. The voltage-impressed current measuring apparatus according to claim 2, wherein
   the operational amplifier has an inverted input terminal and a non-inverted input terminal that is connected to ground; and
   the direct-current power supply portion comprises
      a first resistance inserted between an output of the digital-to-analog converter and the inverted input terminal of the operational amplifier, and
      a second resistance inserted in the feedback path from the load apparatus to the inverted input terminal of the operational amplifier.

8. A voltage-impressed current measuring apparatus according to any of claims 1 to 7, each said current buffer with switch having a pre-stage portion and said output stage,
   wherein said output stages have complementary first and second transistors which have their emitters mutually connected, the voltage of the same connection point taken to be the output voltage of said current buffers with switches, and their collectors connected respectively to a positive power supply and a negative power supply; and
   wherein each of said pre-stage portions comprises
      a first PNP transistor and a first NPN transistor, in which: the emitters are respectively connected to a first and a second constant-current supply; the collectors are respectively connected to a negative power supply and a positive power supply, the voltage from said direct-current power supply portion being supplied to the respective bases as the input voltage; and a first base voltage, the base emitter voltage added to said input voltage, and a second base voltage, the base emitter voltage subtracted from said input voltage, are supplied from the respective emitters to the bases of said complementary first and second transistors;
      a second PNP transistor having a collector and an emitter connected respectively to the base of said complementary second transistor and said positive power supply; a second NPN transistor having a collector and an emitter connected respectively to the base of said complementary first transistor and said negative power supply; and
      a control means, which, when said current buffer with switch is non-selected in response to said control signal, supplies to said first and second constant-current supplies a first and a second OPEN signal changing said first and second constant-current supplies to OFF, supplies a third and a fourth OPEN signal to the bases of said second PNP transistor and said second NPN transistor putting the same transistors into the ON state, thereby holding said complementary first and second transistors of said output stage in the OFF state, and which, when said current buffer with switch is selected, supplies to said first and second constant-current supplies a first and a second OPEN signal changing said first and second constant-current supplies to ON, and supplies a third and a fourth OPEN signal to the bases of said second PNP transistor and said second NPN transistor putting the same transistors into the OFF state, thereby putting said complementary first and second transistors of said output stage into the ON state.

9. The voltage-impressed current measuring apparatus of claim 1, wherein
   the output sides of the plurality of series connections connect to a single terminal of a device under test.

* * * * *